US009666291B2

(12) United States Patent
Park

(10) Patent No.: US 9,666,291 B2
(45) Date of Patent: May 30, 2017

(54) AUTO PROGRAM AND AUTO CYCLING METHOD FOR NON-VOLATILE MEMORY

(71) Applicant: INDUSTRIAL BANK OF KOREA, Seoul (KR)

(72) Inventor: Insun Park, Yongin-si (KR)

(73) Assignee: INDUSTRIAL BANK OF KOREA, Seoul (KR)

( * ) Notice: Subject to any disclaimer, the term of this patent is extended or adjusted under 35 U.S.C. 154(b) by 0 days.

(21) Appl. No.: 14/899,361

(22) PCT Filed: May 22, 2014

(86) PCT No.: PCT/KR2014/004586
§ 371 (c)(1),
(2) Date: Dec. 17, 2015

(87) PCT Pub. No.: WO2014/204103
PCT Pub. Date: Dec. 24, 2014

(65) Prior Publication Data
US 2016/0148699 A1 May 26, 2016

(30) Foreign Application Priority Data
Jun. 18, 2013 (KR) ........................ 10-2013-0069413

(51) Int. Cl.
G11C 16/04 (2006.01)
G11C 16/16 (2006.01)
G11C 29/10 (2006.01)
G11C 29/36 (2006.01)
G11C 29/00 (2006.01)
(Continued)

(52) U.S. Cl.
CPC .............. *G11C 16/16* (2013.01); *G11C 29/00* (2013.01); *G11C 29/10* (2013.01); *G11C 29/16* (2013.01); *G11C 29/18* (2013.01); *G11C 29/36* (2013.01)

(58) Field of Classification Search
CPC ..... G11C 29/44; G11C 29/4401; G11C 29/72; G11C 11/4072; G11C 7/22; G11C 2029/1202; G11C 29/16; G11C 29/838; G11C 29/00; G11C 29/10; G11C 29/18; G11C 16/16
USPC ...... 365/201, 210.1, 210.11, 210.13, 189.05, 365/185.11, 185.18, 185.09
See application file for complete search history.

(56) References Cited

U.S. PATENT DOCUMENTS 5,297,148 A * 3/1994 Harari .................. G06F 3/0601
365/185.09
6,195,771 B1 * 2/2001 Tanabe .................. G11C 29/44
365/201
(Continued)

FOREIGN PATENT DOCUMENTS

KR 1020080060799 A 7/2008
KR 1020090122874 A 12/2009

OTHER PUBLICATIONS

International Search Report mailed Aug. 25, 2014; PCT/KR2014/004856.

*Primary Examiner* — Gene Auduong
(74) *Attorney, Agent, or Firm* — Ladas & Parry LLP

(57) ABSTRACT

Disclosed is a memory test method including receiving a memory test command, receiving pattern information for generating a data pattern to be written in a memory cell, and programming the memory cell according to the pattern
(Continued)

information. According to this method, it is not required to receive external data to be programmed in a cell array.

7 Claims, 19 Drawing Sheets

(51) Int. Cl.
*G11C 29/16* (2006.01)
*G11C 29/18* (2006.01)

(56) References Cited

U.S. PATENT DOCUMENTS

| | | | | |
|---|---|---|---|---|
| 6,981,188 | B2* | 12/2005 | Galzur | G11C 29/44 |
| | | | | 714/718 |
| 7,610,528 | B2* | 10/2009 | Laurent | G11C 29/02 |
| | | | | 365/201 |
| 7,697,355 | B2* | 4/2010 | Kobayashi | G11C 29/838 |
| | | | | 365/185.09 |
| 2003/0033561 | A1* | 2/2003 | Oonk | G11C 29/56 |
| | | | | 714/42 |
| 2008/0104458 | A1 | 5/2008 | Uchida | |
| 2010/0290288 | A1 | 11/2010 | Kang | |
| 2010/0324854 | A1* | 12/2010 | Resnick | G11C 29/26 |
| | | | | 702/108 |
| 2015/0262710 | A1* | 9/2015 | Chakravarty | G11C 29/38 |
| | | | | 714/718 |

* cited by examiner

FIG.5C

501
Condition
- Even B/L Data → bit<0>='0'
- Odd B/L Data → bit<1>='1'
- Inversion Data → bit<2>='0'

Start Address

|  | B/L 0 | B/L 1 | B/L 2 | B/L 3 | B/L 4 | |
|---|---|---|---|---|---|---|
| W/L 0 → | 0 | 1 | 0 | 1 | 0 | No Inversion |
| W/L 1 → | 0 | 1 | 0 | 1 | 0 | No Inversion |
| W/L 2 → | 0 | 1 | 0 | 1 | 0 | No Inversion |
| W/L 3 → | 0 | 1 | 0 | 1 | 0 | No Inversion |
| W/L 4 → | 0 | 1 | 0 | 1 | 0 | No Inversion |
| W/L 5 → | 0 | 1 | 0 | 1 | 0 | No Inversion |
| W/L 6 → | 0 | 1 | 0 | 1 | 0 | No Inversion |
| W/L 7 → | 0 | 1 | 0 | 1 | 0 | No Inversion |

FIG.6

| EndV<7:4> / StartV<3:0> | <0000> | <0001> | <0010> | <0011> | <0100> | <0101> | <0110> (Def.VStart) | <0111> |
|---|---|---|---|---|---|---|---|---|
| Change PGM End & Start Bias(V) (MAX="1111"=21.5V) | +0.0 14.0V | +0.5 14.5V | +1.0 15.0V | +1.5 15.5V | +2.0 16.0V | +2.5 16.5V | +3.0 17.0V | +3.5 17.5V |
| | <1000> +4.0 18.0V | <1001> +4.5 18.5V | <1010> +5.0 19.0V | <1011> +5.5 19.5V | <1100> +6.0 20.0V | <1101> (Def.VEnd) +6.5 20.5V | <1110> +7.0 21.0V | <1111> +7.5 21.5V |

Memory test command,
Start address for programming a memory cell, and
Pattern information for generating a data pattern to be written in the memory cell

AUTO PROGRAM AND AUTO CYCLING METHOD FOR NON-VOLATILE MEMORY

TECHNICAL FIELD

The present invention relates to a technology for testing a NAND flash memory.

BACKGROUND ART

Flash memories, which are non-volatile memories, are generally classified into NAND flash memories and NOR flash memories. Since the NAND flash memories are superior to the NOR flash memories in terms of degree of integration, a NAND structure is mainly used in high-density flash memories. In general, the NAND flash memories include a cell array, a column decoder, and a page buffer. The cell array may include a data cell array for data, a spare cell array, and a redundant cell array for replacing a defective data cell or spare cell.

A test may be performed to check whether such a non-volatile memory operates normally. In the case where a test result indicates the occurrence of a failure in a portion of data cell arrays, a redundant cell array may perform a function of a data cell array in which the failure has occurred, instead of the data cell array.

A NAND flash memory performs a program operation on a page-by-page basis. Therefore, a page program operation is repetitively performed to perform the above-mentioned test. In detail, in order to program one page, a "page program command (e.g., 90h)", a "page address", "program data", and a "program start command (e.g., 10h)" are sequentially input. Therefore, in order to program an entire chip in this manner, the page program command should be repeated for all page addresses.

Furthermore, in order to perform erase/program cycling, a page program for the entire chip or a specific block and a block erase process in which a "block erase command (e.g., 60h), a "block address", and an "erase start command (e.g., D0h)" are sequentially input to erase a block may be repetitively performed.

DISCLOSURE OF THE INVENTION

Technical Problem

The present invention provides a technology for automatically testing a NAND flash memory with ease. In particular, the present invention provides a technology for completing a test even if a command is input to a memory only once without inputting external data for the test to the memory.

Technical Solution

In a NAND flash memory test method according to an aspect of the present invention, a command, so-called "auto program", is input only once so that a test is automatically performed in a page level, a block level, or an entire chip level, unlike a conventional method in which a test is performed by repeatedly inputting a page-based program command.

In a NAND flash memory test method according to another aspect of the present invention, data of a specific pattern is internally generated so as to be programmed in a cell array, instead of directly inputting data to be written in the cell array. For example, a test may be perform by repeatedly writing, in the cell array, data of a pattern such as '00', '0101', '0110', '1010', '1001', or '11'.

According to the present invention, at least two test modes may be provided. The first mode is an auto program mode, and the second mode is an auto cycling mode.

A memory test method according to an aspect of the present invention includes receiving a memory test command, receiving pattern information for generating a data pattern to be written in a memory cell, and programming the memory cell according to the pattern information.

The memory test method may further include receiving a start address for the programming, and the pattern information may include information on a value to be programmed in a wordline having the start address.

The pattern information may include information on a value to be programmed in an odd bitline of the wordline having the start address and a value to be programmed in an even bitline of the wordline.

A first data pattern may be programmed in a first wordline of the memory cell, and a second data pattern may be programmed in a second wordline adjacent to the first wordline, and the pattern information may include information for determining whether to generate the second data pattern so that the second data pattern is equal to the first data pattern or generate the second data pattern by inverting the first data pattern.

The programming the memory cell may include programming a first wordline, wherein, in the case where the programming the first wordline fails, the programming the first wordline may be repeated.

When the programming the first wordline is repeated, a bias voltage for the memory cell may be increased.

The programming the memory cell may include programming a first wordline and programming another wordline when the programming the first wordline is successful.

The memory test method may further include receiving condition data for programming the memory cell. The condition data may include information on a maximum number of times of performing programming a specific wordline, and information for determining whether to perform a test for another wordline or end a memory test, when all of results of the performing the programming the specific wordline the maximum number of times indicate a failure.

The programming the memory cell may include a first process including erasing a first block and programming the first block, a second process of repeating the first process while increasing a block address from a start block address to an end block address, and a third process of repeating the second process a predetermined cycle number of times.

A memory according to another aspect of the present invention includes an input pad, a memory cell, and a control logic electrically connected to the input/output pad and the memory cell, wherein the control logic receives, from the input pad, a memory test command and pattern information for generating a data pattern to be written in the memory cell, and programs the memory cell according to the pattern information.

The control logic may further receive a start address for the programming from the input pad, and the pattern information may include information on a value to be programmed in a wordline having the start address.

The pattern information may include information on a value to be programmed in an odd bitline of the wordline having the start address and a value to be programmed in an even bitline of the wordline.

A first data pattern may be programmed in a first wordline of the memory cell, and a second data pattern may be programmed in a second wordline adjacent to the first wordline, and the pattern information may include information for determining whether to generate the second data pattern so that the second data pattern is equal to the first data pattern or generate the second data pattern by inverting the first data pattern.

Advantageous Effects

The present invention may provide a technology for automatically testing a NAND flash memory with ease. As a result, a test time may be reduced, and a test may be controlled with ease.

BRIEF DESCRIPTION OF THE DRAWINGS

FIGS. 5A to 5H are diagrams illustrating patterns of data programmed in accordance with an embodiment of the present invention.

FIG. 6 illustrates an example of a bias voltage setting range in accordance with an embodiment of the present invention.

MODE FOR CARRYING OUT THE INVENTION

Hereinafter, embodiments of the present invention will be described in detail with reference to the accompanying drawings so that the embodiments of the present invention are easily carried out by those skilled in the art. However, the present invention may be implemented in various different forms and should not be construed as being limited to the embodiments described herein. The terminology used herein is not for delimiting the present invention but for describing specific embodiments. Furthermore, the singular forms used herein include the plural forms as well, unless otherwise indicated.

Figure 1:
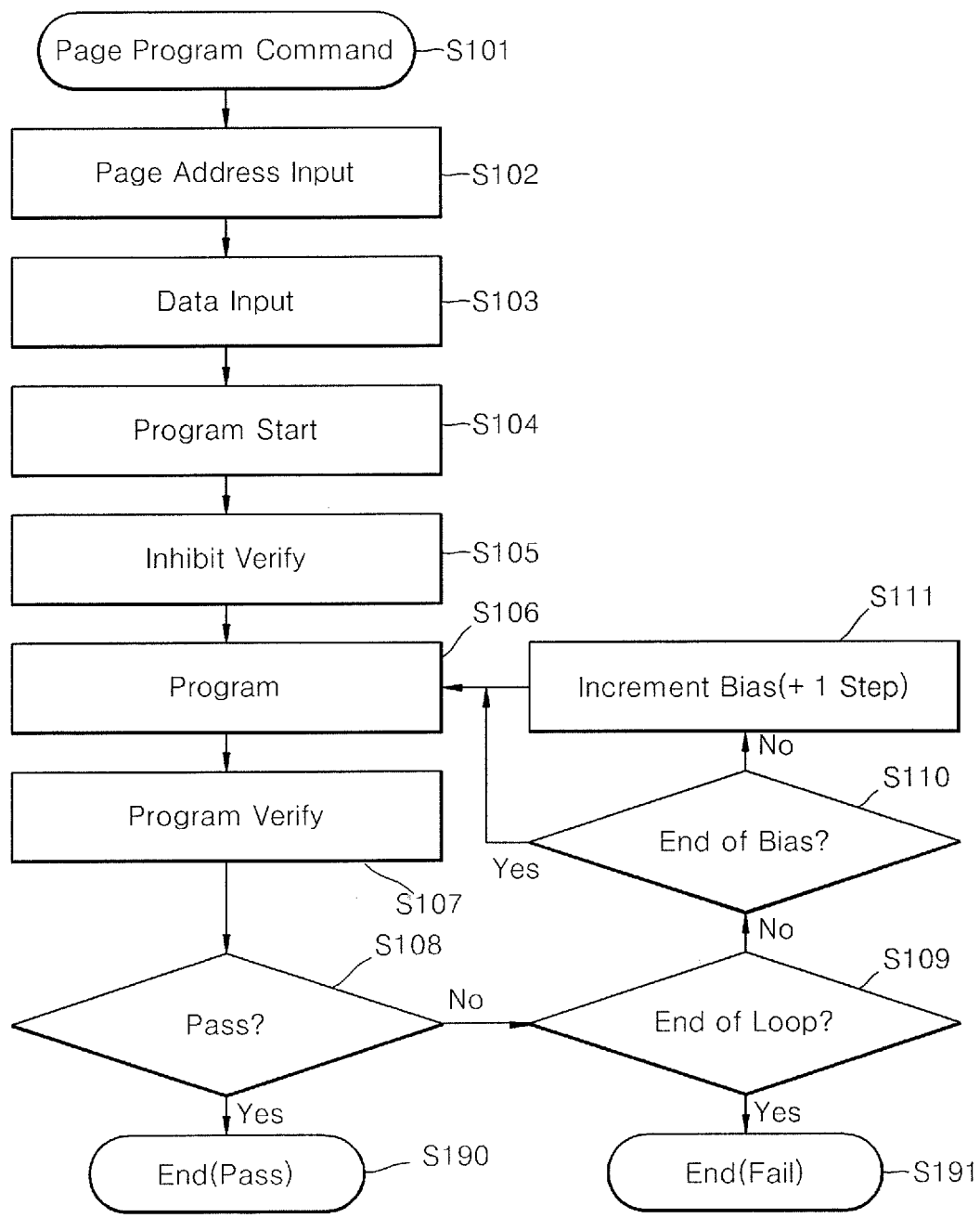
FIG. 1 is a flowchart of a conventional page program test.

FIG. 1 is a flowchart of a conventional page program test.

In order to perform a page program, a page program command is input in step S101, a page address of a page to be tested is input in step S102, and data to be programmed is input in step S103. The program is started in step S104, and an inhibit state of a NAND memory is verified in step S105. Here, inhibit verification represents a step of reading initial cell array data for an address to be programmed. In detail, an initial cell data state is read before programming input data at the address so that appropriate handling is performed in next step S106. For example, an already programmed cell is not additionally programmed in step S106.

Thereafter, a program operation is performed in step S106, and a program result is verified in step S107. If it is determined that the test is passed as a result of program verification in step S108, the process is terminated with a pass in the page program test (S190). However, if it is determined that the test is not passed as a result of program verification in step S108, step S109 is performed. In step S109, it is determined whether the program has been performed a preset maximum loop number of times. If the program has been performed the preset maximum loop number of times, the process is terminated with a failure in the page program test (S191). However, if the program has not been performed the preset maximum loop number of times in step S109, step S110 is performed. In step S110, it is determined whether a bias voltage applied to a memory cell reaches a preset maximum value. Step S106 is simply performed again if the preset maximum value is reached, but step S111 is performed if the preset maximum value is not reached. In step S111, the bias voltage applied to the memory cell is increased by one step. Then, once step S111 is completed, the program of step S106 is performed again.

Figure 2:
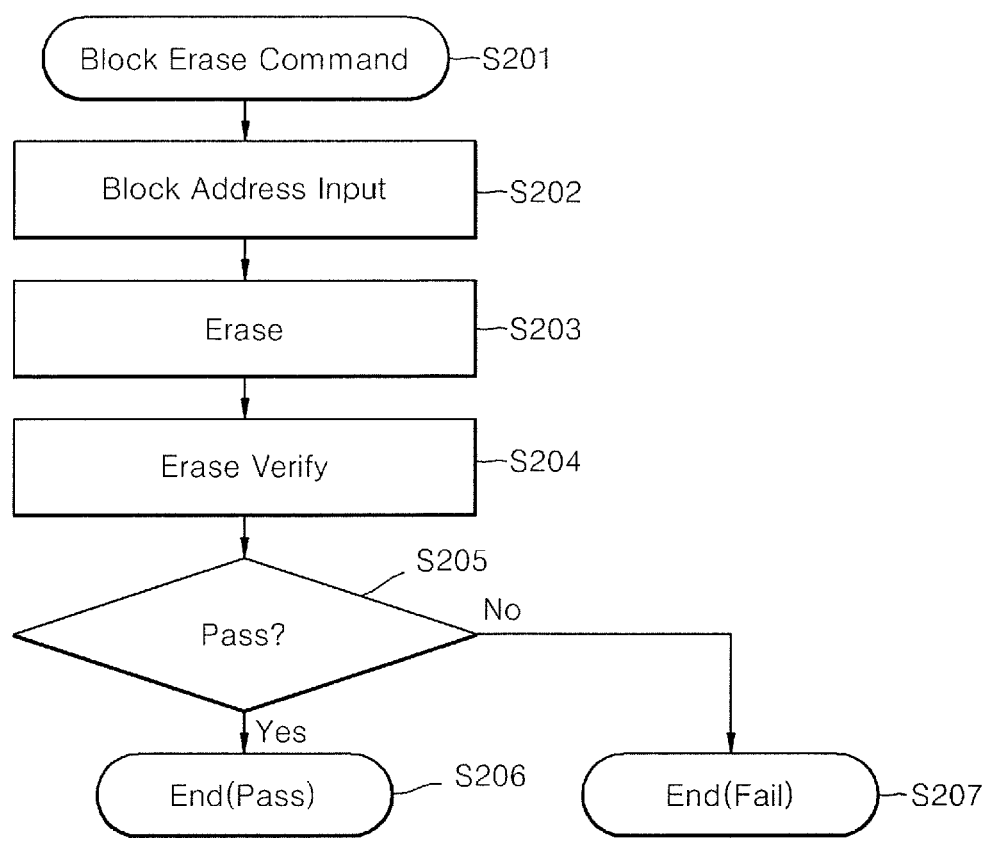
FIG. 2 is a flowchart of a conventional block erase operation.

FIG. 2 is a flowchart of a conventional block erase operation.

In order to perform a block erase operation, a block erase command is input in step S201, and a block address to be erased is input in step S202. A corresponding block is erased in step S203, and an erase state is verified in step S204. It is determined whether erase verification is passed in step S205, and, if the erase verification is passed, the block erase operation is terminated while outputting a result indicating a pass in the erase verification (S206), but, if the erase verification is not passed, the block erase operation is terminated while outing a result indicating a failure in the erase verification (S207).

Auto Program

Figure 3:
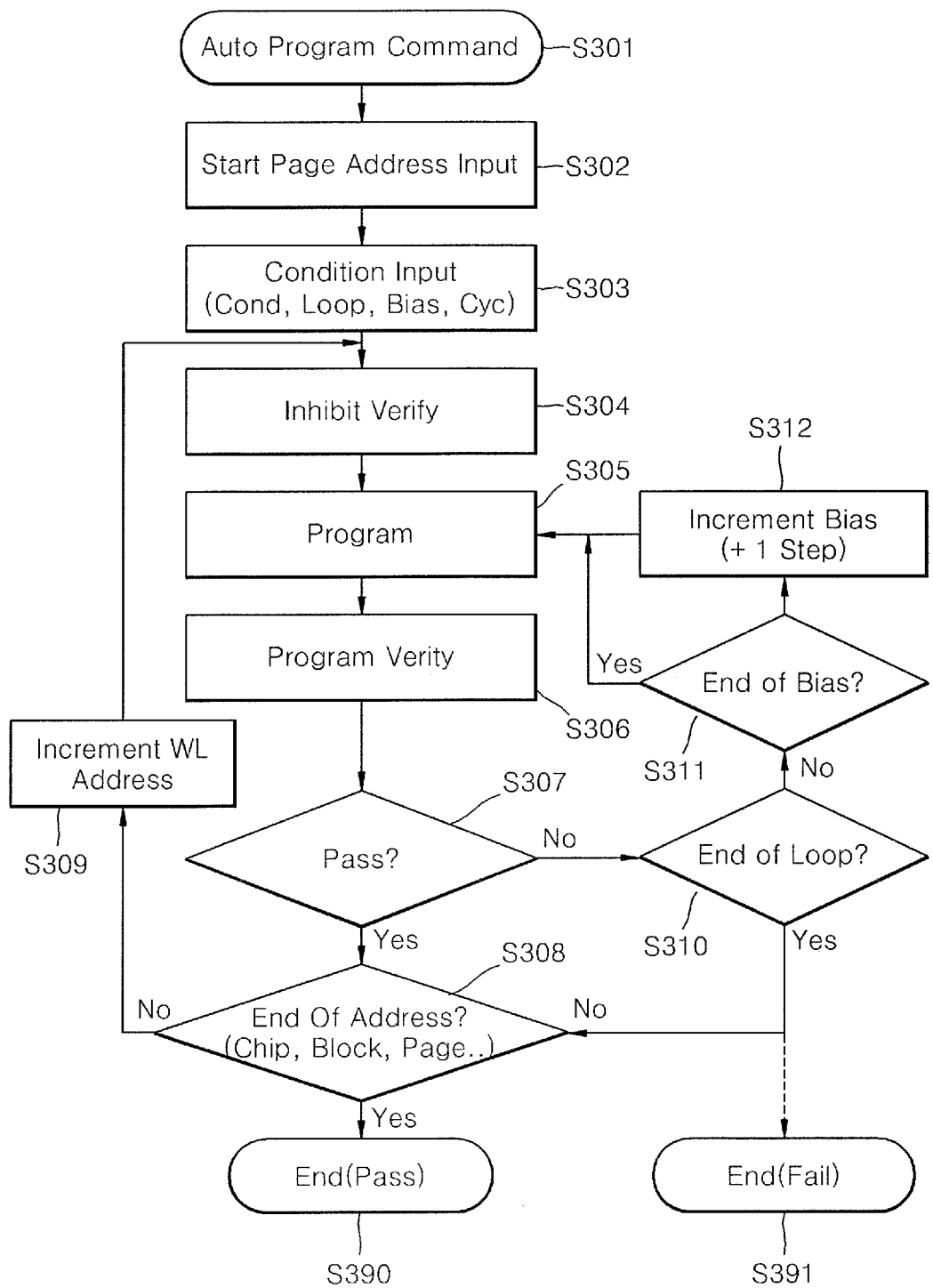
FIG. 3 is a flowchart illustrating a method for executing an auto program in a NAND flash memory in accordance with an embodiment of the present invention.

FIG. 3 is a flowchart illustrating a method for performing an auto program on a NAND flash memory in accordance with an embodiment of the present invention.

The auto program represents a program for specifying a memory cell area to be tested and programming a specific pattern with one command. That is, sequential page programming is internally enabled with one command. Here, a program operation is performed on a wordline-by-wordline basis. In the case where the program operation fails with respect to a specific wordline (or page), the program operation is repeated a preset loop number of times. Here, every time the program operation is repeated, a bias voltage for the program operation may be increased.

Referring to FIG. 3, the NAND flash memory receives an auto program command in step S301, and receives a start page address in step S302.

In step S303, specific test conditions for an auto program are received. According to the test conditions, the flowchart illustrated in FIG. 3 may be modified. These conditions are described below with reference to FIG. 4 and Table 1.

Thereafter, an initial cell state is verified through inhibition reading in step S304, and a program is performed in step S305. A program result is verified in step S306, and it is determined whether verification is passed in step S307. If the verification is passed, step S308 is performed, or, if the verification is not passed, step S310 is performed.

In step S308, it is determined whether an address of a last wordline (=page) is reached. For example, in the case where the auto program is performed for an entire chip, it is determined whether an address of a last wordline of the chip is reached. For another example, in the case where the auto program is performed only for a predetermined number of blocks, it is determined whether an address of a last wordline of a last block is reached. For another example, the auto program may be performed only for a predetermined number of pages, and, in this case, it is determined whether an address of a last wordline of a last page is reached.

If it is determined that the address of the last wordline is reached in step S308, the process is terminated while outputting a result indicating a pass in an auto program test (step S390), since it is not required to further perform the test. However, if it is determined that the address of the last wordline is not reached in step S308, a wordline address is increased in step S309. Thereafter, steps S304 to S308 are repetitively performed.

Meanwhile, if it is determined that the verification is not passed in step S307 as described above, step S310 is performed. In step S310, it is determined whether the program has been performed a preset maximum loop number of times so that a last loop is reached. In the case where the last loop is reached, which indicates a failure in the auto program test, the process proceeds to step S391 to perform a fail stop if a state value of I/O bit 6 of Table 1 is 1 in step S310, or, if the state value is 0, the process proceeds to step S308.

However, if it is determined that the last loop is not reached in step S310, step S311 is performed. In step S311, it is determined whether a bias voltage applied to a memory cell reaches a preset last value. Step S305 is simply performed again if the preset last value is reached, but step S312 is performed if the preset last value is not reached. In step S312, the bias voltage applied to the memory cell is increased by one step. Then, once step S312 is completed, the program of step S305 is performed again.

Figure 4:
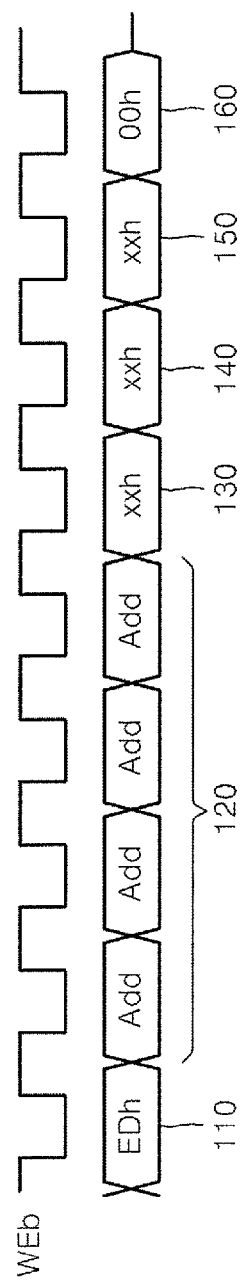
FIG. 4 is a timing diagram of external signals input to a memory to perform an auto program according to FIG. 3.

FIG. 4 is a timing diagram of external signals input to a memory to perform an auto program test according to FIG. 3.

Referring to FIG. 4, a command, an address, and various parameter data for specifying the data are input in response to an external synchronization clock WEb. In an interval 110, a code (e.g., EDh) corresponding to an auto program command may be input. Thereafter, in an interval 120, a start address of a cell array for which an auto program is to be performed may be input. Thereafter, in an interval 130, condition data for the auto program command may be input. The condition data may be configured as shown in Table 1 below.

TABLE 1

| I/O | Condition data | |
|---|---|---|
| | State | Description |
| 7 | 0/1 | Fail stop when failure occurs |
| 6 | | |
| 5 | 0/1/2/3 | Page/block(A18)/sector(A27)/chip |
| 4 | | |
| 3 | 0/1 | Pass/force fail |
| 2 | 0/1 | Normal/odd WL inversion |
| 1 | 0/1 | Odd B/L data |
| 0 | 0/1 | Even B/L data |

The condition data will be described in detail with reference to Table 1. In this embodiment, the condition data includes six types of information and is represented by 8 bits.

Firstly, bits <7:6> relate to information for immediately terminating an auto program without increasing an address in the case where a program result indicates a failure. The flowchart of FIG. 3 represents an algorithm in which a program is performed once or multiple times for a specific page, and, if a program performance result indicates a pass, the program is performed for a next page. For example, in the case where the bits <7:6> are set as '01', if programming fails even if the program operation is repeated a preset maximum loop number of times for the specific page, it may be determined that the auto program fails and the auto program may be immediately terminated without programming for a next page. However, for example, in the case where the bits <7:6> are set as '00', if programming fails even if the program operation is repeated a preset maximum loop number of times for the specific page, the process may proceed to step S308 without terminating the auto program.

Secondly, bits <5:4> relate to information for setting an area for which the auto program is to be performed. In an embodiment of the present invention, the auto program may be performed for one page including the above-mentioned start address, one block including the above-mentioned start address, one section including the above-mentioned start address, or the entire chip. For example, in the case where the bits <5:4> are set as '00', '01', '10', or '11', the auto program may be performed for one page, one block, one sector, or the entire chip respectively. The condition data shown in Table 1 is merely an example, and may be modified in another embodiment so that an arbitrary section within a cell array is defined to perform the auto program.

Thirdly, a bit <3> represents a bit for setting a pass condition or a force fail condition. If the bit is set as the pass condition, in the case where a pass is achieved in step S307 of FIG. 3, the process proceeds to step S309 for increasing a page address. However, if the bit is set as the force fail condition, the process forcibly proceeds to step S310 regardless of whether a pass is achieved in step S307 of FIG. 3. Therefore, if the force fail condition is set using the bit <3>, the program operation may be set to be unconditionally performed the maximum loop number of times. The force fail condition may be used to filter out a defective cell by applying a stress to a memory.

Fourthly, a bit <2> represents a bit for automatically making a pattern of data to be programmed. In a memory in which the auto program in accordance with an embodiment of the present invention is performed, data to be written in a portion or all of cell arrays is generated internally and automatically without receiving the data from the outside. The bit <2> serves to set data written in two physically adjacent wordlines so that the data have inverted values. For example, in the case where the bit <2> is set as '1', two data on the same bitline of a wordline WL#[k] and a wordline WL#[k+1] have opposite values, or, in the case where the bit <2> is set as '0', two data on the same bitline of the wordline WL#[k] and the wordline WL#[k+1] have the same value.

Fifthly, a bit <1> represents a data value of odd bitlines of a first wordline for which the auto program is performed.

Sixthly, a bit <0> represents a data value of even bitlines of the first wordline for which the auto program is performed.

As a result, data programmed in a memory area for which the auto program is performed are determined by the above-mentioned bits <2:0>. A set of data values of odd and even bitlines of the first wordline, for which the auto program is performed, is determined by a value set by the bits <1:0>. Thereafter, it is determined, based on the bit <2>, whether to directly use the set of data values or invert the set of data values to use it every time a wordline address is increased in step S309 of FIG. 3.

FIGS. 5A to 5H are diagrams illustrating patterns of data programmed in accordance with an embodiment of the present invention.

The wordline W/L 0 shown in FIGS. 5A to 5H corresponds to a start address of the auto program.

Figure 5A:
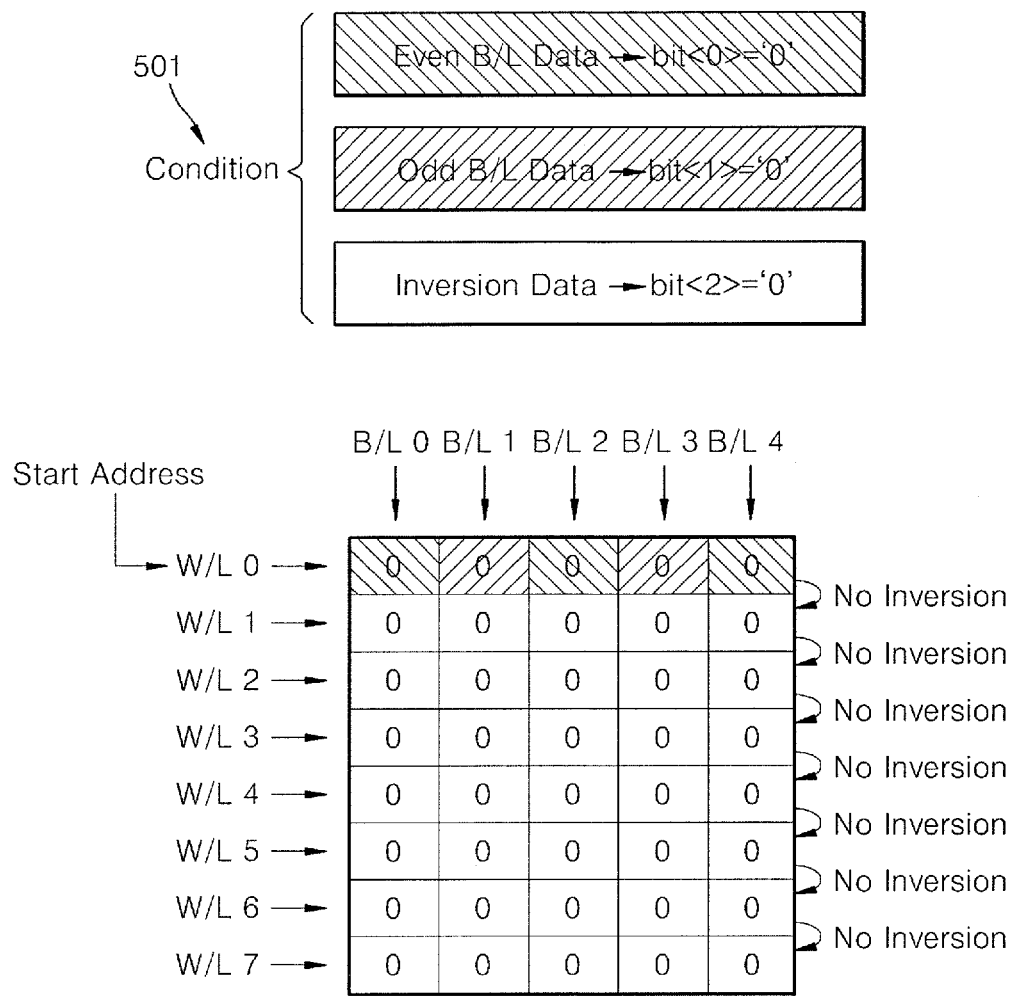
Figure 5B:
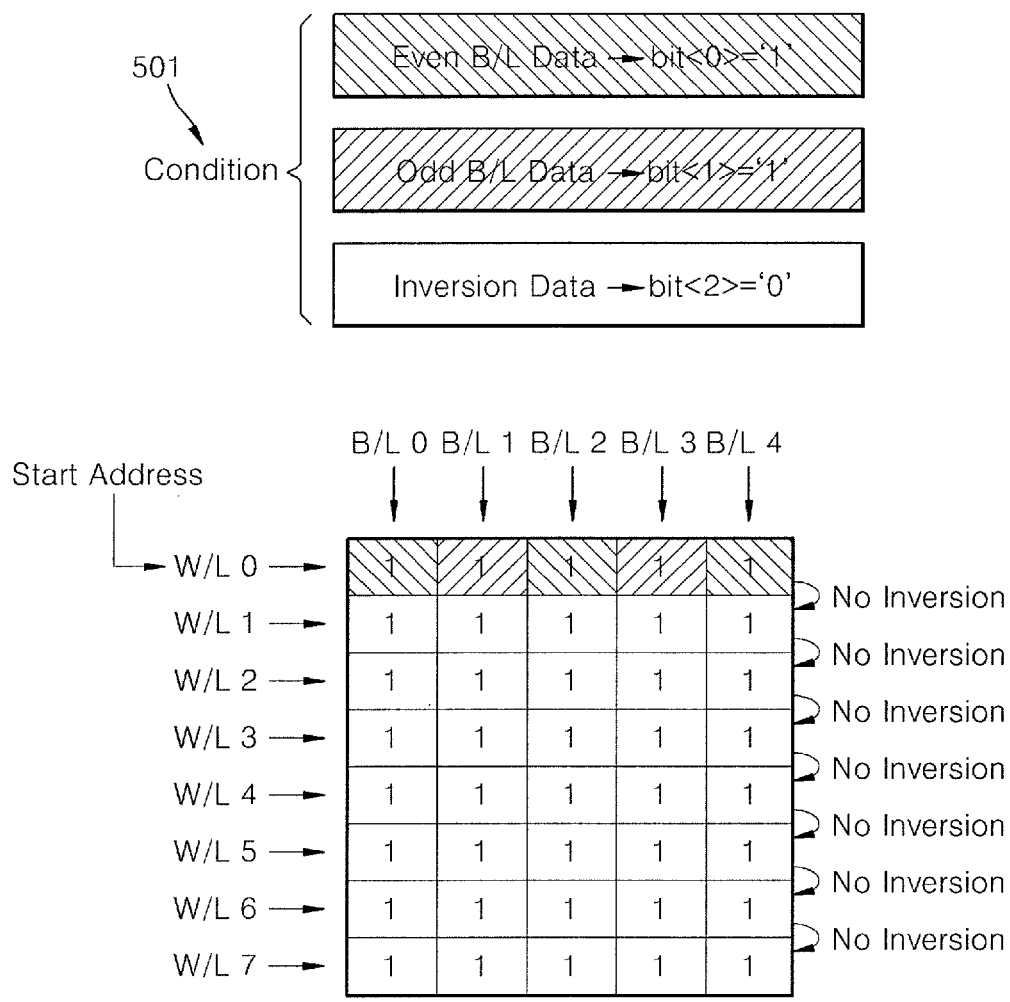
Figure 5D:
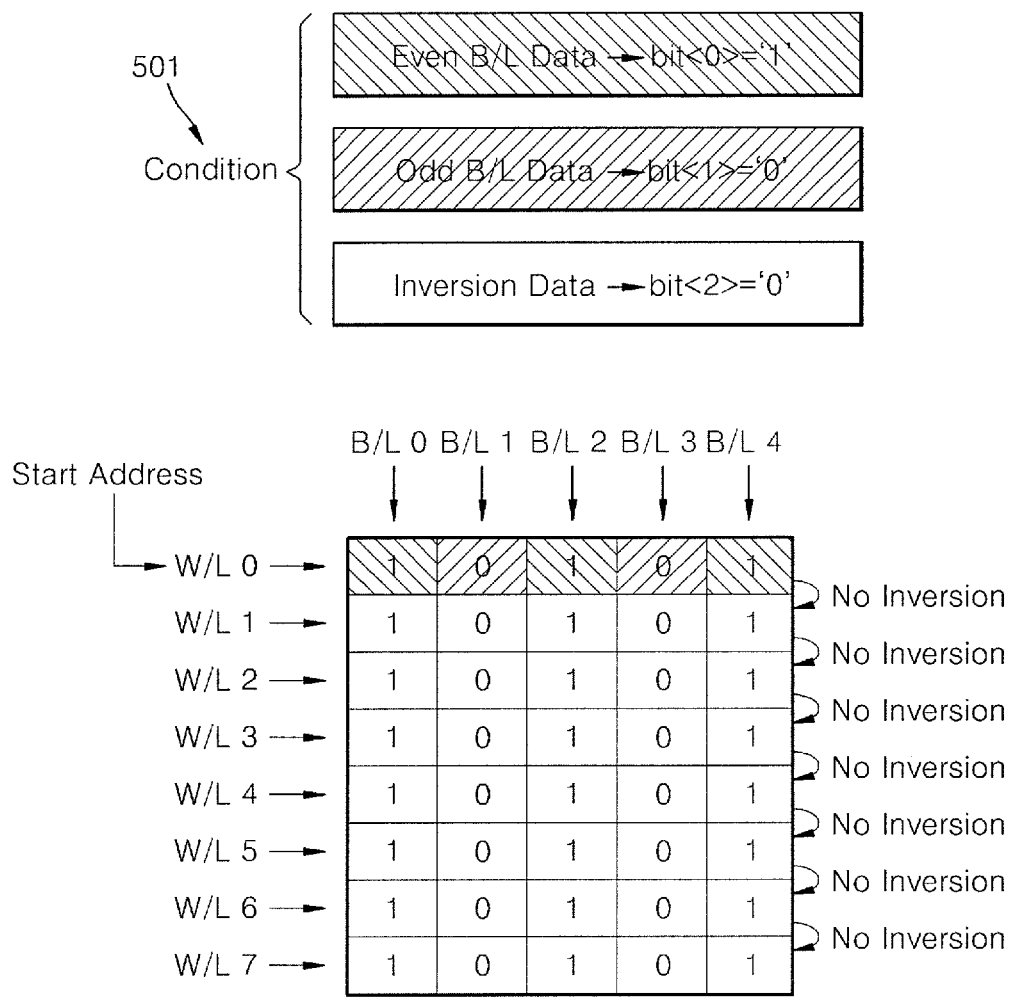
Figure 5E:
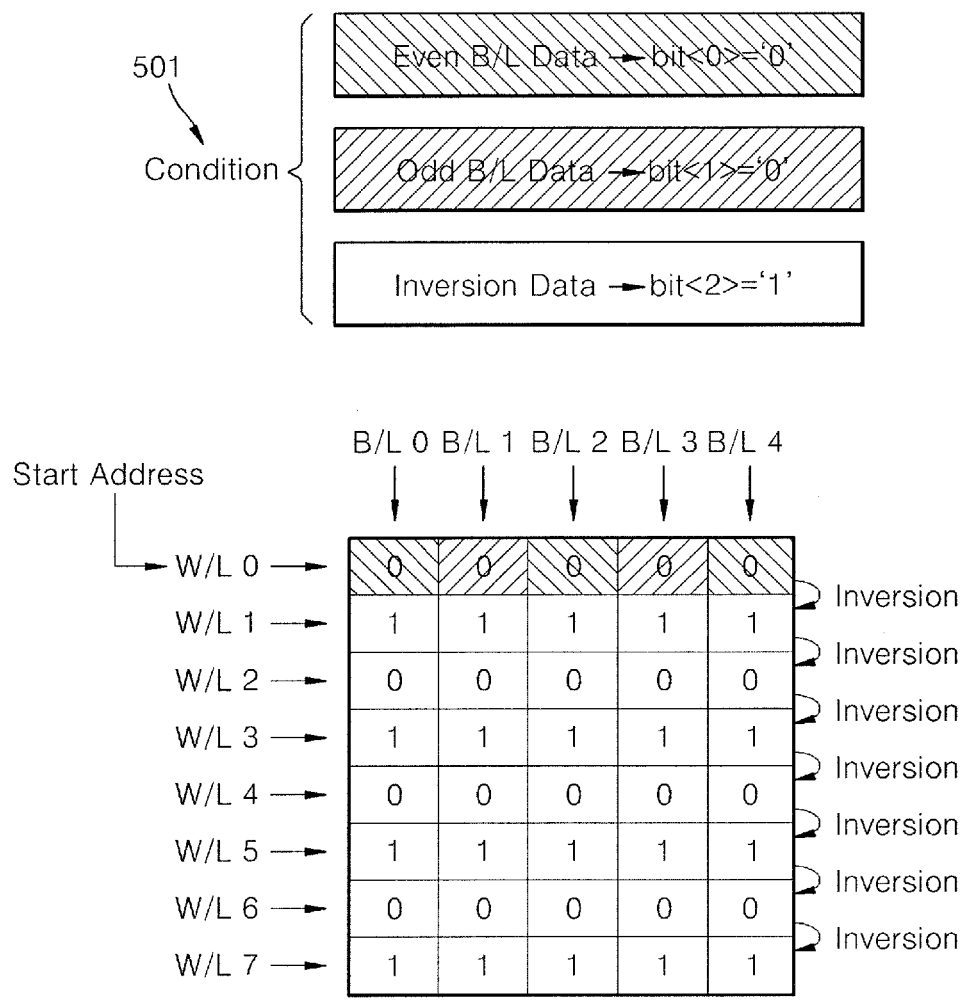
Figure 5F:
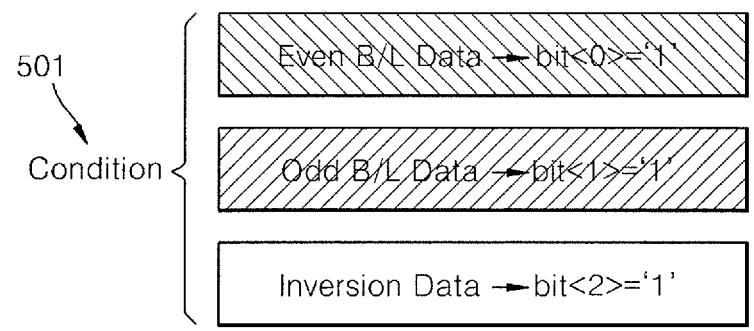
Figure 5F:
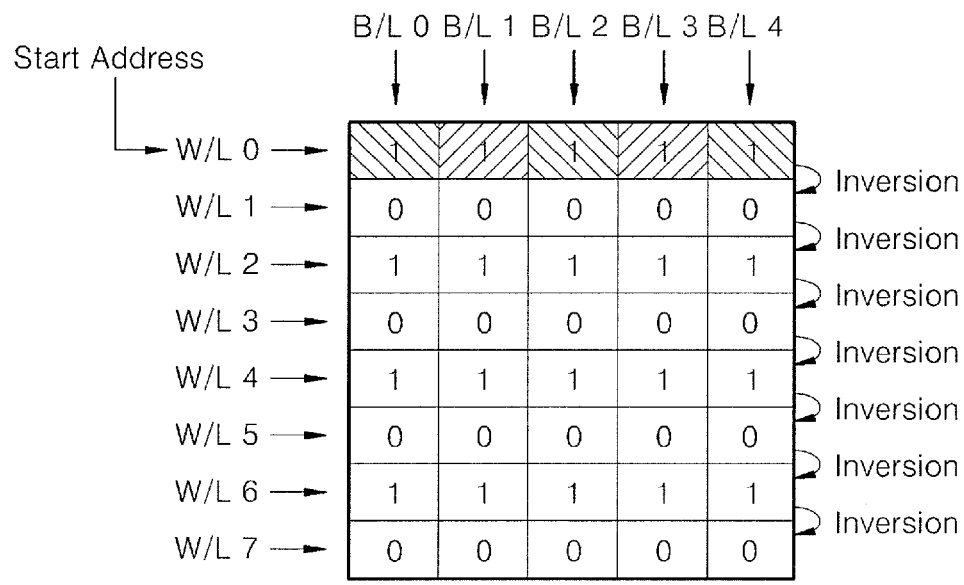
Figure 5G:
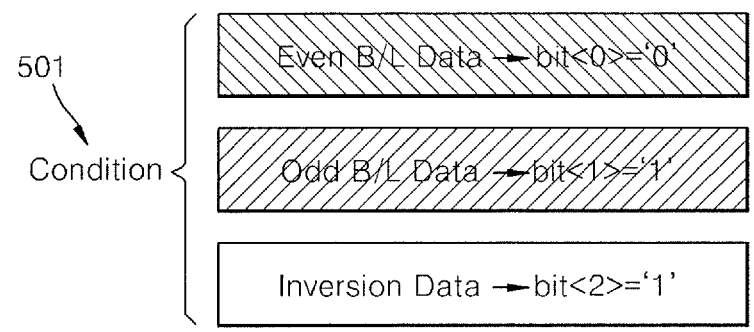
Figure 5G:
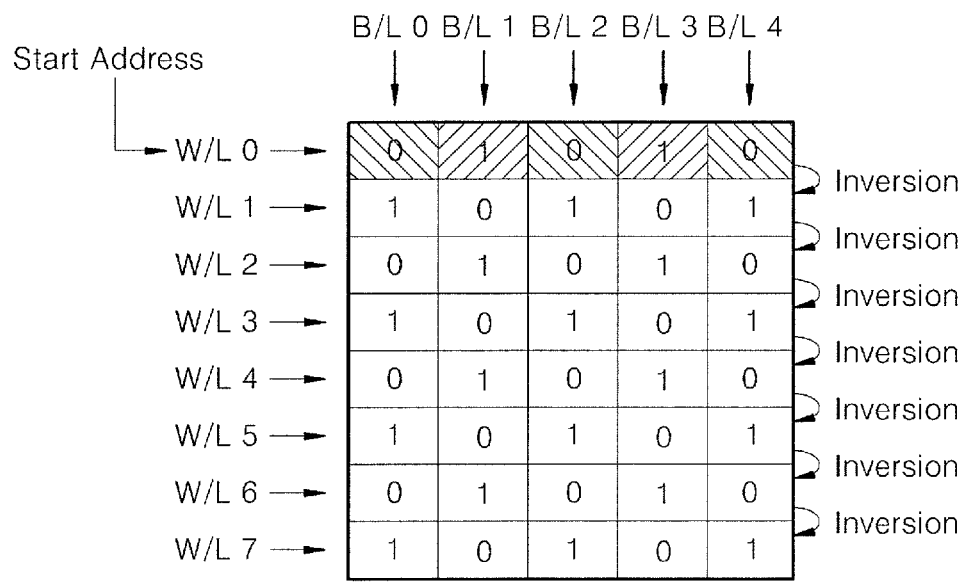
Figure 5H:
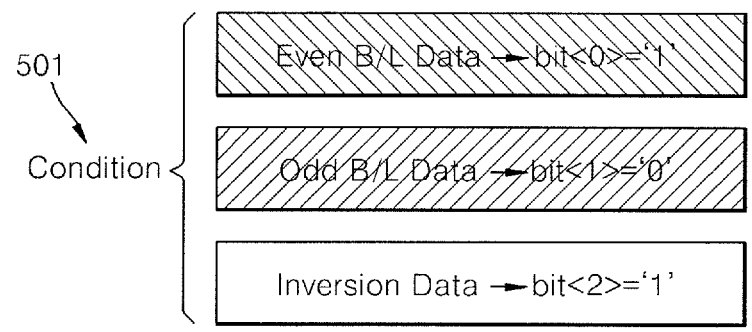
Figure 5H:
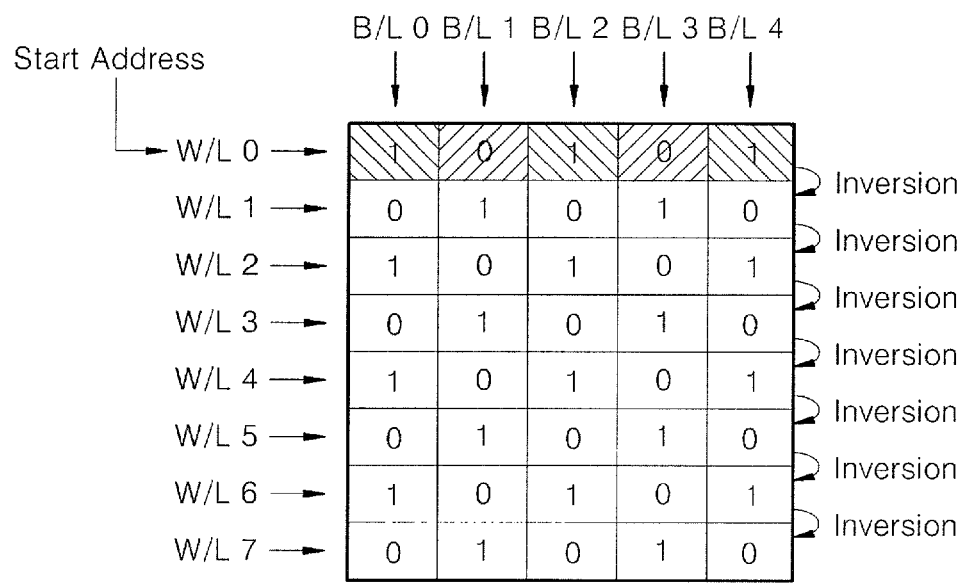

FIG. 5A illustrates the case of a condition 501 in which a value of even bitlines (bit<0>) of the wordline W/L 0 is set as '0' by the bit <0>, a value of odd bitlines of the wordline W/L 0 is set as '1' by the bit <1>, and there is no inversion between adjacent wordlines due to the bit <2>. It would be understood that a pattern of data to be programmed in the wordline W/L 0 is determined by the bits <1:0>, and a pattern of data to be programmed in another wordline is determined by the bit <2>.

FIGS. 5A to 5H illustrate examples of all of eight (=2^3) combinations of the three bits <2:0>, and the diagrams of FIGS. 5B to 5H may be understood based on the description of FIG. 5A.

The following description is provided with reference to FIG. 4.

In an interval 140, information for determining a loop number of the auto program is input. For example, if 5-bit data is input, the loop number may be determined as any one of values from 1 to 32 (=2^5). A value obtained in the interval 140 may affect step S310 of FIG. 3.

Thereafter, in an interval 150, information for setting a range of voltage to be applied to a wordline of a memory cell to perform the auto program is received. According to the flowchart of FIG. 3, a re-attempt to perform the program operation is made the preset maximum loop number of times in the case where a program result indicates a failure. Here, every time the re-attempt is made, the voltage applied to the memory cell may be increased by one step. Here, a start voltage StartV (=minimum voltage) and an end voltage EndV (=maximum voltage) may be set, so that the bias voltage may be increased by one step from the minimum voltage to the maximum voltage every time the loop is repeated. An example of a range of the bias voltage determined using the information input in the interval 150 is described below with reference to FIG. 6.

FIG. 6 illustrates an example of a bias voltage setting range in accordance with an embodiment of the present invention.

Referring to FIG. 6, each of the start voltage and the end voltage may be represented by 4-bit information, and may thus have values of 16 (=2^4) steps. In the case where 8-bit information is input in the interval 150, the start voltage may be determined by lower four bits <3:0>, and the end voltage may be determined by upper four bits <7:4>. FIG. 6 illustrates the case where the upper four bits are '1101' (=20.5 V), and the lower four bits are '0110' (=17.0 V). Here, in steps S311 and S312 of FIG. 3, the bias voltage may be increased up to 20.5 V.

In the example of FIG. 6, the bias voltage may be increased seven times in total from 17.0 V up to 20.5 V. However, if the maximum loop value is set as four in the interval 140, the bias voltage may be increased by only four steps from 17.0 V to 18.5 V. That is, according to the flowchart of FIG. 3, the loop value is preferentially applied over the bias voltage value. However, according to an embodiment, the bias voltage value may be referentially applied over the loop value.

Furthermore, the start voltage may be set as any one of the 16 steps shown in the table of FIG. 6, and the end voltage may also be set as any one of the 16 steps shown in the table of FIG. 6. However, in another embodiment, the start voltage and the end voltage may be selected according to different tables.

Referring back to FIG. 4, information input to the memory in an interval 160 may not be used for the auto program. Instead of being used for the auto program, the information input in the interval 160 may be used for auto cycling described below.

Auto Cycling Test

Figure 7:
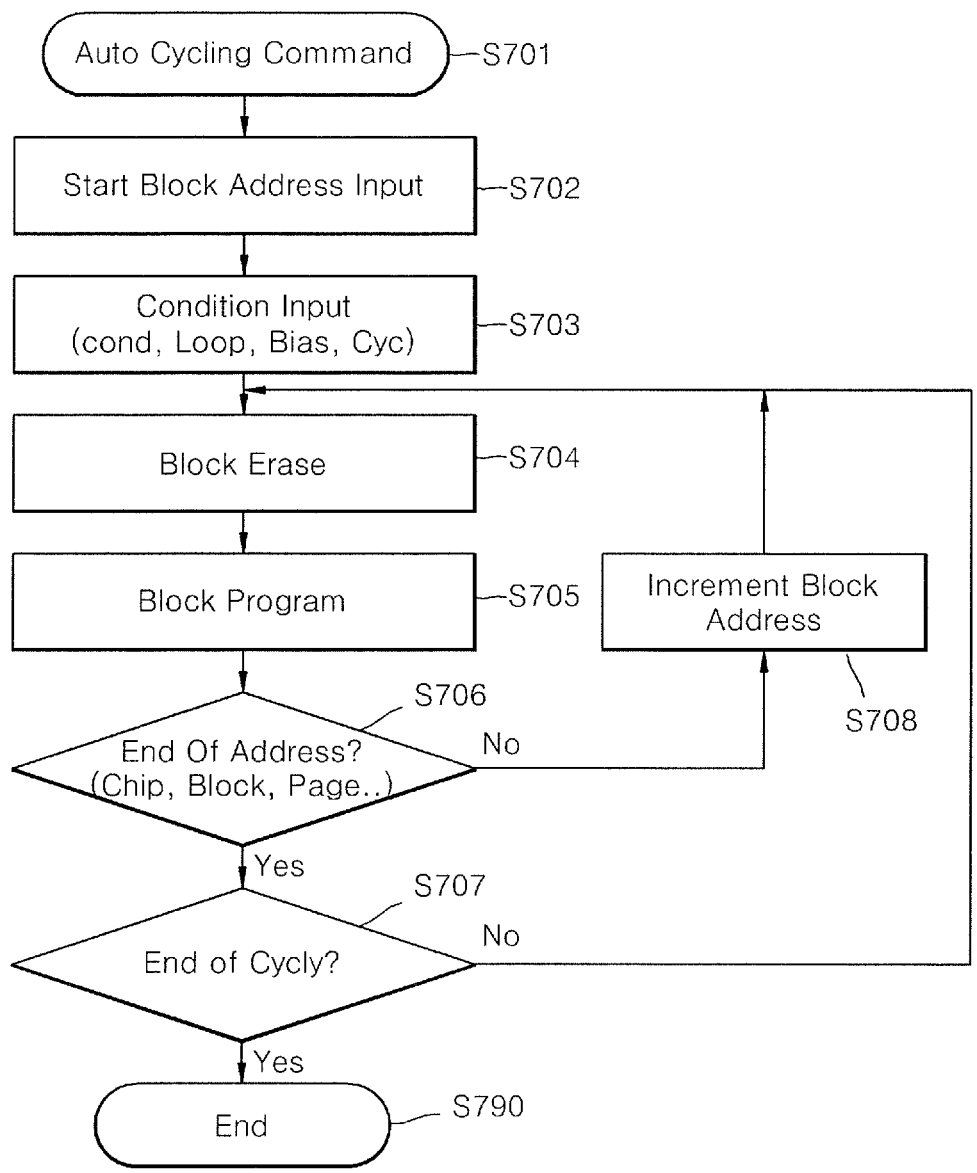
FIG. 7 is a flowchart illustrating a method for performing auto cycling on a NAND flash memory in accordance with an embodiment of the present invention.
Figure 8:
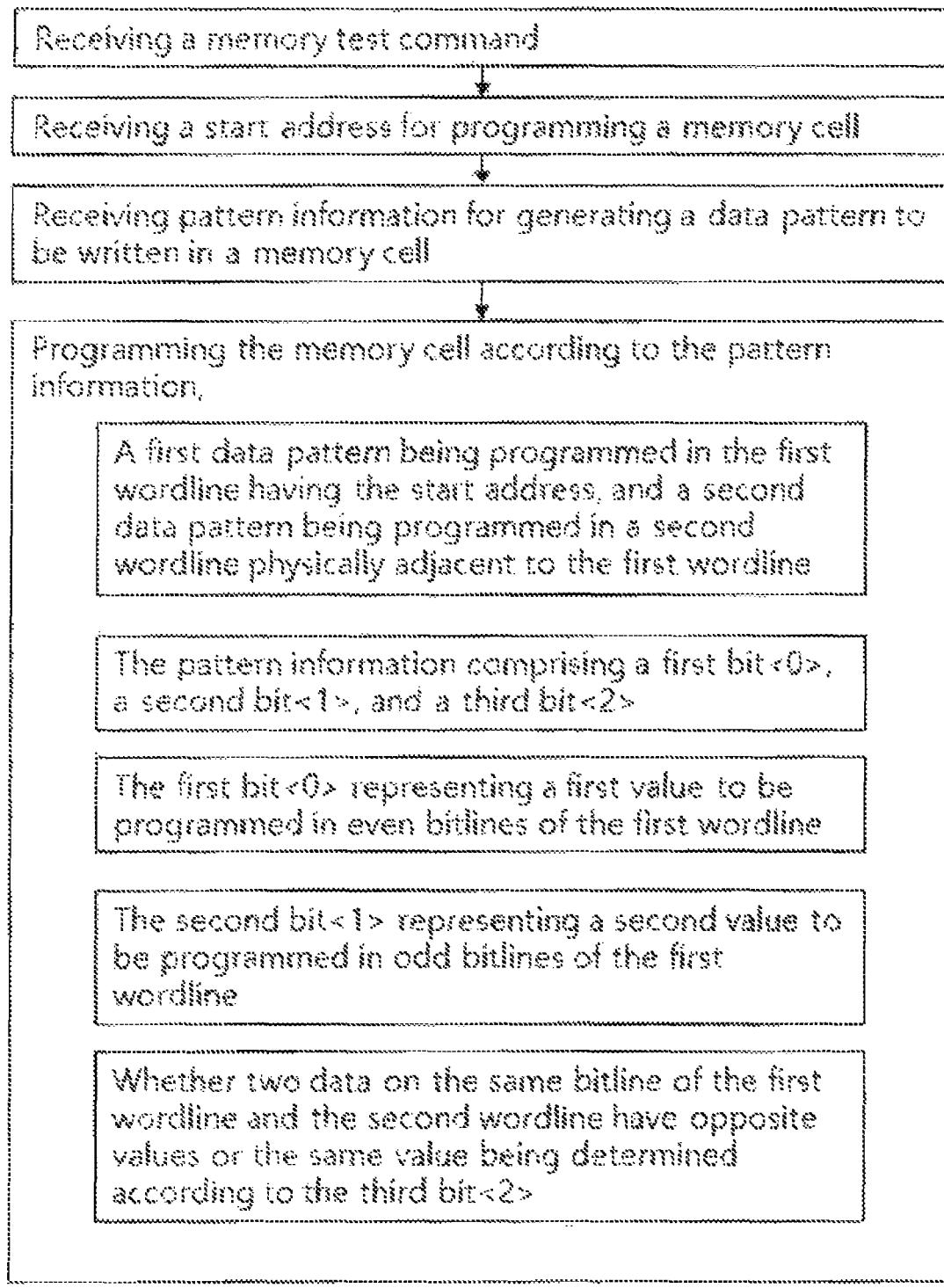
FIG. 8 is a flowchart describing a memory test method according to one embodiment of the present invention.
Figure 9:
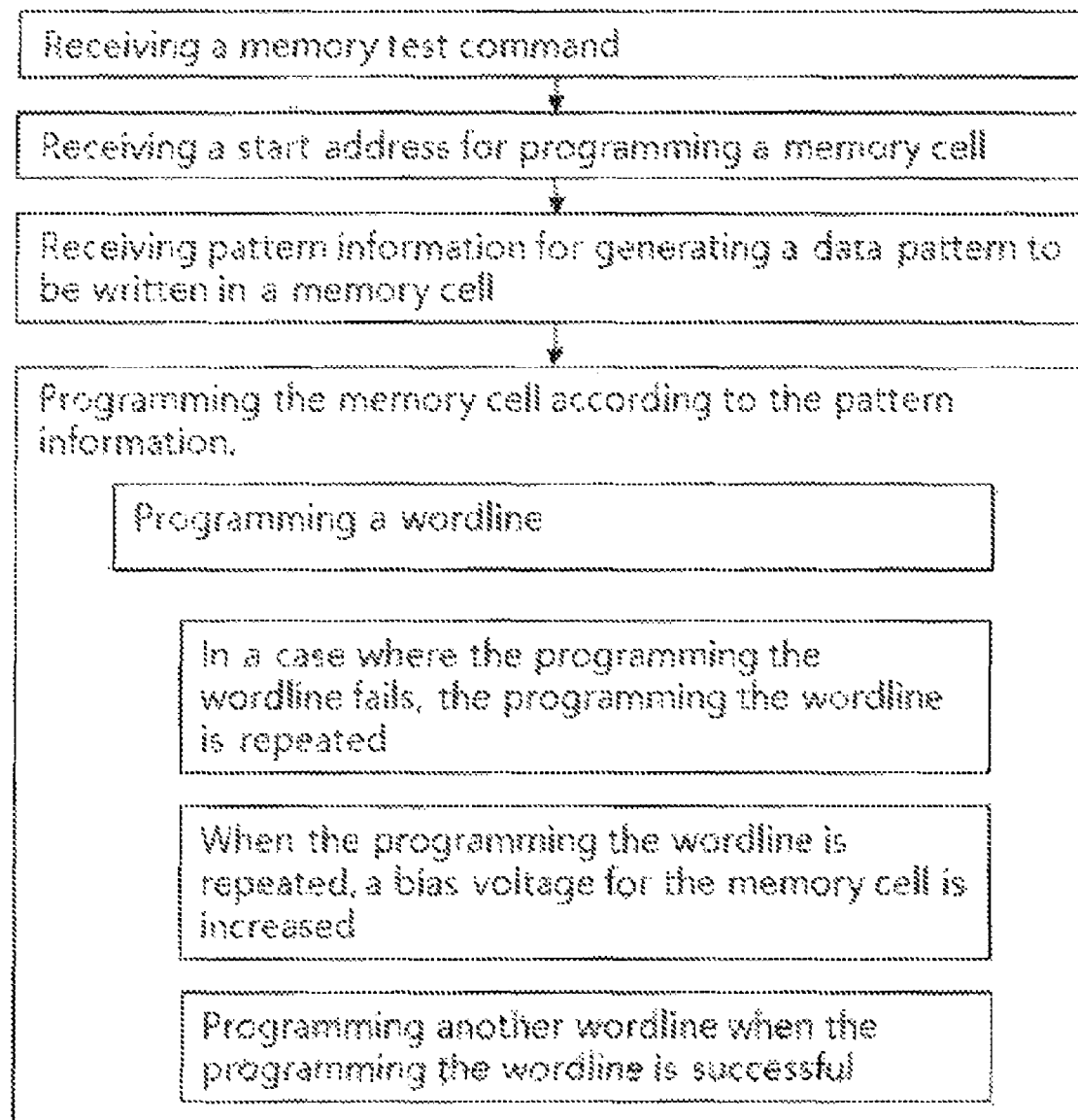
FIG. 9 is a flowchart describing a memory test method according to other embodiment of the present invention.
Figure 10:
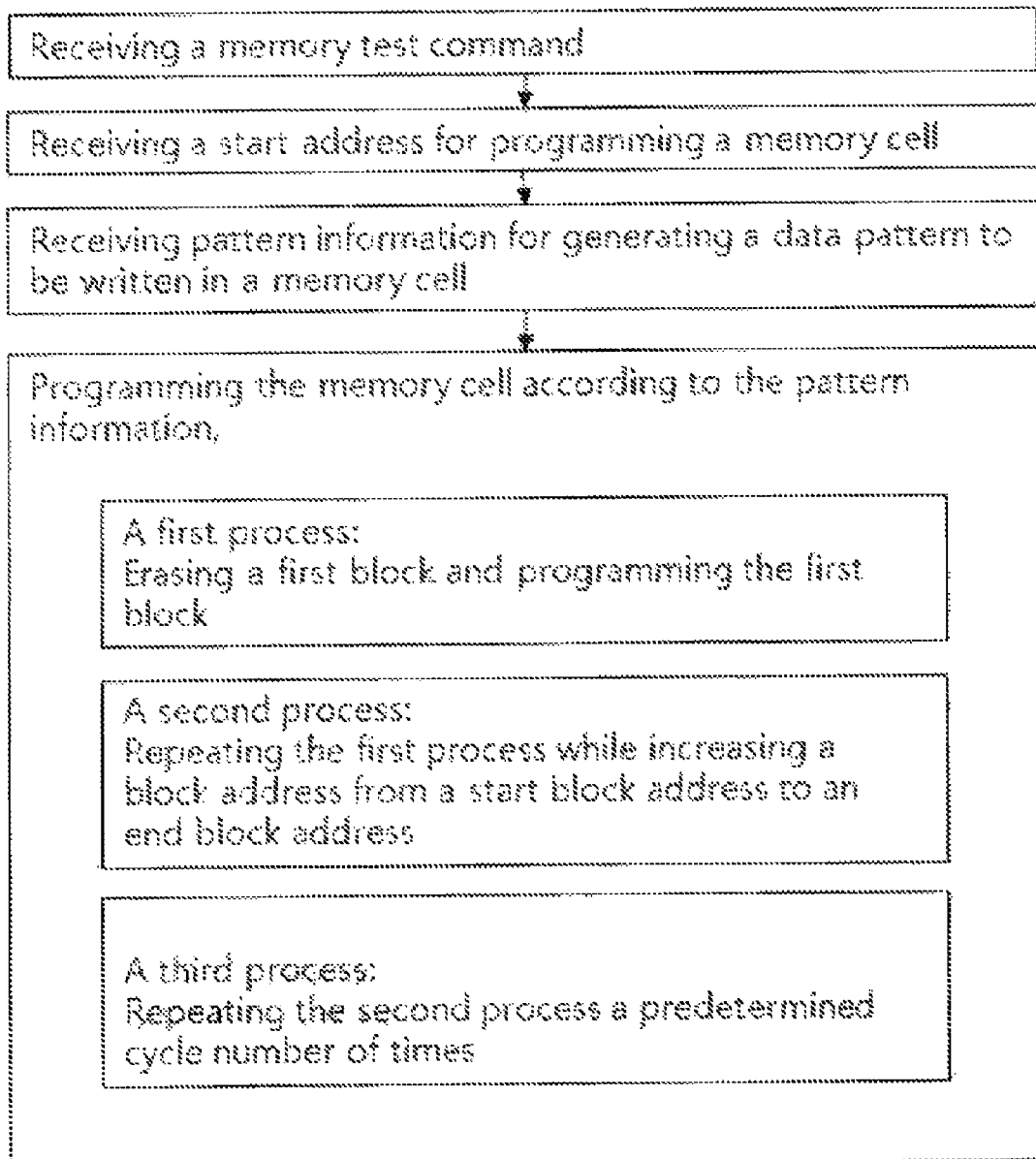
FIG. 10 is a flowchart describing a memory test method according to another embodiment of the present invention.
Figure 11:
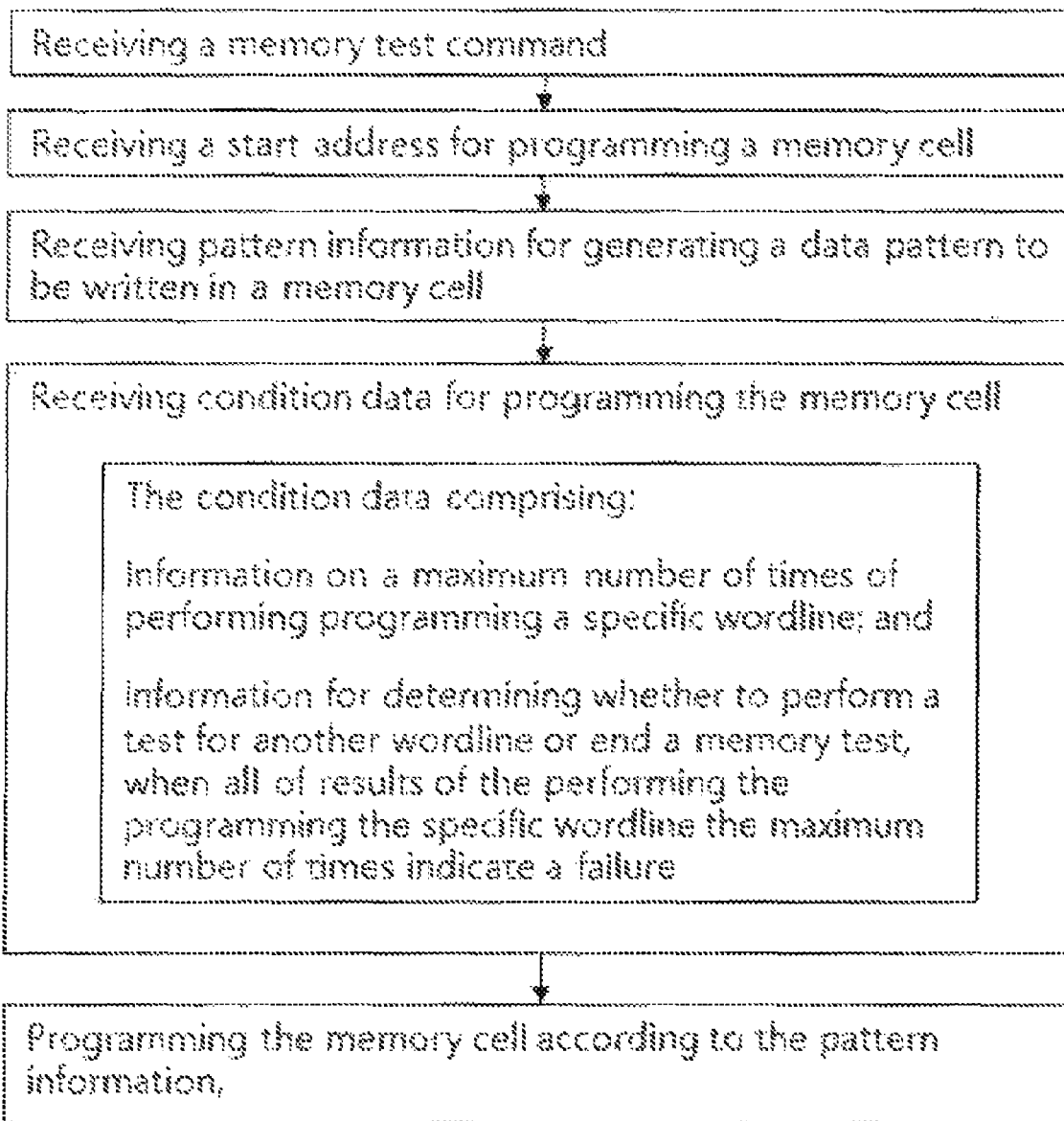
FIG. 11 is a flowchart describing a memory test method according to still another embodiment of the present invention.
Figure 12:
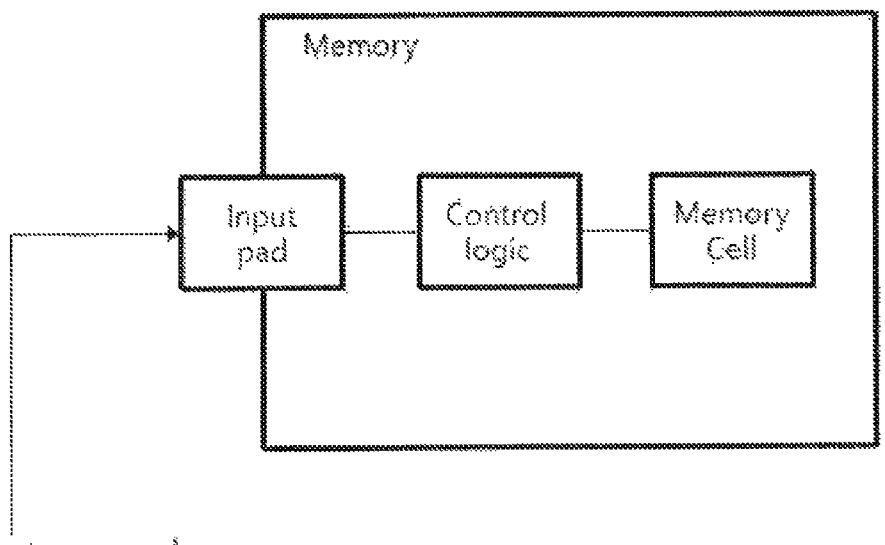
FIG. 12 is a block diagram representing a memory according to one embodiment of the present invention.

FIG. 7 is a flowchart illustrating a method for performing auto cycling on a NAND flash memory in accordance with an embodiment of the present invention.

The auto cycling represents a test in which an erase and program operation is repetitively performed a preset cycle number of times. Here, the erase and program operation may be performed on a block-by-block basis. Furthermore, not only a cycle but also a bias voltage for the erase and program operation may be preset to perform a test. FIG. 4 may be used as an example of a timing diagram of external signals input to a memory to perform auto cycling according to the flowchart of FIG. 7. However, in this case, the auto program command (e.g., EDh) illustrated in FIG. 4 is changed into an auto cycling command (e.g., EAh). Furthermore, Table 1 may be used as an example of specific test conditions for the auto cycling according to the flowchart of FIG. 7.

Referring to FIG. 7, the NAND flash memory receives an auto cycling command (e.g., EAh) in step S701, and receives a start block address in step S702. Thereafter, in step S703, specific test conditions for an auto cycling test are received. According to the test conditions, the flowchart illustrated in FIG. 7 may be modified.

Block erase is performed in step S704, a block program is performed in step S705, and then it is determined whether a last address is reached in step S706. For example, in the case where the auto cycling is performed for an entire chip, it is determined whether a last address of the chip is reached. For another example, in the case where the auto cycling is performed only for a predetermined number of blocks, it is determined whether a last address of a last block is reached. For another example, the auto cycling may be performed only for one predetermined page, and, in this case, the start address is the last address.

In an embodiment of the present invention, erase is performed on a block-by-block (=multiple wordlines) basis, and a program may be performed on a page-by-page (=one wordline) basis. Therefore, since the erase and the program are repetitively performed in the cycling test, it may be required to determine an end of a specified range at an arbitrary time. Criteria for this determination may be a block address, a wordline (=page) address, or both.

If it is determined that the last address is reached in step S706, it is determined whether a preset last cycle is reached in step S707. If it is determined that the last cycle is reached in step S707, the auto cycling test is ended (S790). However, if it is determined that the last cycle is not reached in step S707, the process returns to step S704.

Meanwhile, if it is determined that the last address is not reached in step S706, the block address is increased in step S708, and the process returns to step S704. Here, step S708 is performed in the case where the operation is performed for a chip or a sector, but step S708 may be skipped in the case where the operation is performed for one block or page.

The timing diagram of FIG. 4 and Table 1 may be used to perform the auto cycling illustrated in FIG. 7. Here, a page mode based on the bits <5:4> of Table 1 may not be supported for the auto cycling. The information input in the loop value setting interval 140 and the bias voltage setting interval 150 may be used in step S705. Here, step S705 may include the above-mentioned auto program.

However, in the interval 160 of FIG. 4, information on a cycle to be used in step S707 of FIG. 7 may be received from the outside of the memory. For example, the information received in the interval 160 may be represented by eight bits, and, in this case, the cycle may have a value of up to 256 (=2^8). According to an embodiment, the maximum value of the cycle may be set as a value other than 256.

Although embodiments of the present invention have been described, those skilled in the art could easily make various alterations or modifications without departing from the essential characteristics of the present invention.

Therefore, the embodiments disclosed herein should be considered to be not limitative but illustrative, and the scope of the present invention should be defined not by the above description but by the claims, and all differences that fall within the same scope as the claims should be construed as being covered by the present invention.

The invention claimed is:

1. A memory test method comprising:
   receiving a memory test command;
   receiving a start address for programming a memory cell;
   receiving pattern information for generating a data pattern to be written in a memory cell; and
   programming the memory cell according to the pattern information, wherein a first data pattern is programmed in the first wordline having the start address, and a second data pattern is programmed in a second wordline physically adjacent to the first wordline,
   the pattern information comprises a first bit<0>, a second bit<1>, and a third bit<2>,
   the first bit<0> represents a first value to be programmed in even bitlines of the first wordline,
   the second bit<1> represents a second value to be programmed in odd bitlines of the first wordline, and
   whether two data on the same bitline of the first wordline and the second wordline have opposite values or the same value is determined according to the third bit<2>.

2. The memory test method of claim 1,
   wherein the programming the memory cell comprises programming a wordline,
   wherein, in a case where the programming the wordline fails, the programming the wordline is repeated.

3. The memory test method of claim 2, wherein, when the programming the wordline is repeated, a bias voltage for the memory cell is increased.

4. The memory test method of claim 1, wherein the programming the memory cell comprises:
   programming a wordline; and
   programming another wordline when the programming the wordline is successful.

5. The memory test method of claim 1, further comprising:
   receiving condition data for programming the memory cell,
   wherein the condition data comprises:
   information on a maximum number of times of performing programming a specific wordline; and
   information for determining whether to perform a test for another wordline or end a memory test, when all of results of the performing the programming the specific wordline the maximum number of times indicate a failure.

6. The memory test method of claim 1, wherein the programming the memory cell comprises:
   a first process comprising erasing a first block and programming the first block;
   a second process of repeating the first process while increasing a block address from a start block address to an end block address; and
   a third process of repeating the second process a predetermined cycle number of times.

7. A memory comprising an input pad, a memory cell, and a control logic electrically connected to the input pad and the memory cell,
   wherein the control logic receives, from the input pad, a memory test command, a start address for programming the memory cell, and pattern information for generating a data pattern to be written in the memory cell, and programs the memory cell according to the pattern information, wherein a first data pattern is programmed in a first wordline having the start address, and a second data pattern is programmed in a second wordline physically adjacent to the first wordline,
   the pattern information comprises a first bit<0>, a second bit<1>, and a third bit<2>,
   the first bit<0> represents a first value to be programmed in even bitlines of the first wordline,
   the second bit<1> represents a second value to be programmed in odd bitlines of the first wordline, and
   whether two data on the same bitline of the first wordline and the second wordline have opposite values or the same value is determined according to the third bit<2>.

* * * * *